United States Patent [19]
Sakaue

[11] Patent Number: 5,347,156
[45] Date of Patent: Sep. 13, 1994

[54] LATERAL BIPOLAR TRANSISTOR WITH A PARTICULAR COLLECTOR STRUCTURE

[75] Inventor: Hisashi Sakaue, Kyoto, Japan

[73] Assignee: Rohm Co., Ltd., Kyoto, Japan

[21] Appl. No.: 900,386

[22] Filed: Jun. 18, 1992

[30] Foreign Application Priority Data

Jul. 26, 1991 [JP] Japan .................................. 3-187764

[51] Int. Cl.⁵ ........................ H01L 29/70; H01L 29/73
[52] U.S. Cl. .................................... 257/575; 257/557; 257/556; 257/552
[58] Field of Search ............... 257/557, 356, 552, 539, 257/575

[56] References Cited
U.S. PATENT DOCUMENTS 4,804,634  2/1989  Krishna et al. ...................... 257/557
5,081,517  1/1992  Contiero et al. ..................... 257/557

Primary Examiner—Rolf Hille
Assistant Examiner—Wael Fahmy
Attorney, Agent, or Firm—Nikaido, Marmelstein, Murray & Oram

[57] ABSTRACT

A lateral transistor includes a semiconductor substrate, a buried layer formed on the semiconductor substrate, an epitaxial layer formed on the buried layer in such a manner that the epitaxial layer is a p-type or n-type (first conductivity-type), a diffusion zone having a second conductivity-type opposite to the first conductivity-type and including an emitter zone and collector zone formed on the epitaxial layer, and a base zone. The base zone includes an epitaxial layer interposed between the emitter zone and the collector zone. The collector zone is formed within a well zone in such a manner that the well zone has the same type conductivity as the collector zone and a lower concentration than the collector zone.

1 Claim, 1 Drawing Sheet

LATERAL BIPOLAR TRANSISTOR WITH A PARTICULAR COLLECTOR STRUCTURE

FIELD OF THE INVENTION

The present invention relates to a lateral transistor arranged in a semiconductor device and more particularly to a lateral transistor wherein a current amplification factor is improved.

BACKGROUND OF THE INVENTION

In a process of producing a general bipolar integrated circuit in which semiconductor elements are combined, the production process becomes complicated if a n-p-n type transistor and a p-n-p type transistor are arranged in the same chip in such a manner that an emitter junction is opposed to a collector junction. Accordingly, a lateral transistor operating in a lateral direction and having a structure shown in FIG. 2 is used as a p-n-p type transistor in the integrated circuit.

In FIG. 2, numeral 1 denotes a p-type semiconductor substrate, numeral 2 denotes a n+ type buried layer, and numeral 3 denotes a n-type epitaxial layer which is a first conductivity-type layer formed on the semiconductor substrate 1. Numeral 4 denotes a n+-type layer for connecting a base electrode wherein impurity such as a phosphorus is diffused with high concentration in the n-type epitaxial layer 3. Numerals 5 and 6 denote p+-type layers, which are second conductivity-type layers, wherein acceptor impurity such as a boron and, a boron fluoride is diffused to form a collector zone and an emitter zone respectively. The collector zone 5 and the emitter zone 6 are generally formed just when a p-type diffusion of another n-p-n transistor (not shown) is formed.

With respect to the lateral p-n-p type transistor stated above, current flows in the neighborhood of a surface of the transistor due to its structure. Accordingly, the is p-n-p type transistor easily effected by the surface thereof and current amplification factor $h_{fe}$ is generally small. The current amplification factor $h_{fe}$ can be increased by allowing a positive hole from the emitter to effectively reach the collector by narrowing a base width, i.e. a distance ($W_b$ in FIG. 2 ) between the collector zone 5 and the emitter zone 6 or enlarging the collector.

In order to narrow the base width in this kind of transistor, the spacing between the collector zone and the emitter zone must be narrowed when the collector zone 5 and the emitter zone 6 are formed by diffusion of impurity. Forming accuracy cannot be, however, improved so much due to limitations in accuracy of a photomask, adjusting accuracy in transfer, pattern definition of a resist, exposure and etching accuracy, occurrence of a defect caused by dust, and the like. Thus, there are limitations in narrowing the base width.

Further in the conventional structure, the collector zone 5 has the same depth as the emitter zone 6 since the collector zone 5 is formed just when the emitter zone 6 is formed, that is, the collector zone 5 and the emitter zone 6 are simultaneously formed. Thus, many positive holes injected through the emitter move under the collector zone 5 and directly reach the base electrode 4, or directly reach the semiconductor substrate 1 via a buried layer 2. Therefore, there is a problem that the positive holes which do not reach the collector zone are increased so that the current amplification factor cannot be increased.

SUMMARY OF THE INVENTION

In view of the above circumstances, an object of the present invention is to provide a lateral transistor wherein carriers supplied from the emitter can effectively reach the collector whereby the current amplification factor is improved.

In accordance with the present invention, there is provided a lateral transistor comprising:
 (a) a semiconductor substrate;
 (b) a buried layer formed in the semiconductor substrate;
 (c) an epitaxial layer formed on the buried layer and having a first conductivity-type of p-type or n-type;
 (d) two diffusion zones formed on the epitaxial layer and having a second conductivity-type opposite to the first conductivity-type, the two diffusion zones being an emitter zone and a collector zone;
 (e) a well zone surrounding the collector zone; and
 (f) a base zone comprising an epitaxial layer interposed between the emitter zone and the collector zone wherein the well zone which has the same conductivity-type as the collector zone and a lower concentration than the collector zone.

According to the present invention, the collector zone is formed within the well zone having the same conductivity-type as the collector zone and lower concentration than the collector zone. Further, the well zone is deeply formed to a degree that the well zone almost comes into contact with the buried-layer formed on the semiconductor substrate. Accordingly, the carriers injected through the emitter are prevented from directly reaching the base or the semiconductor substrate and all the carriers reach the collector, so that the current amplification factor is improved.

Further, since the well zone is formed, the base width is easily narrowed due to a lateral spread of thermal diffusion and distance between the collector and emitter can be made small. Thus, the current amplification factor can be further improved.

DETAILED DESCRIPTION OF THE PREFERRED EMBODIMENT

Figure 1:
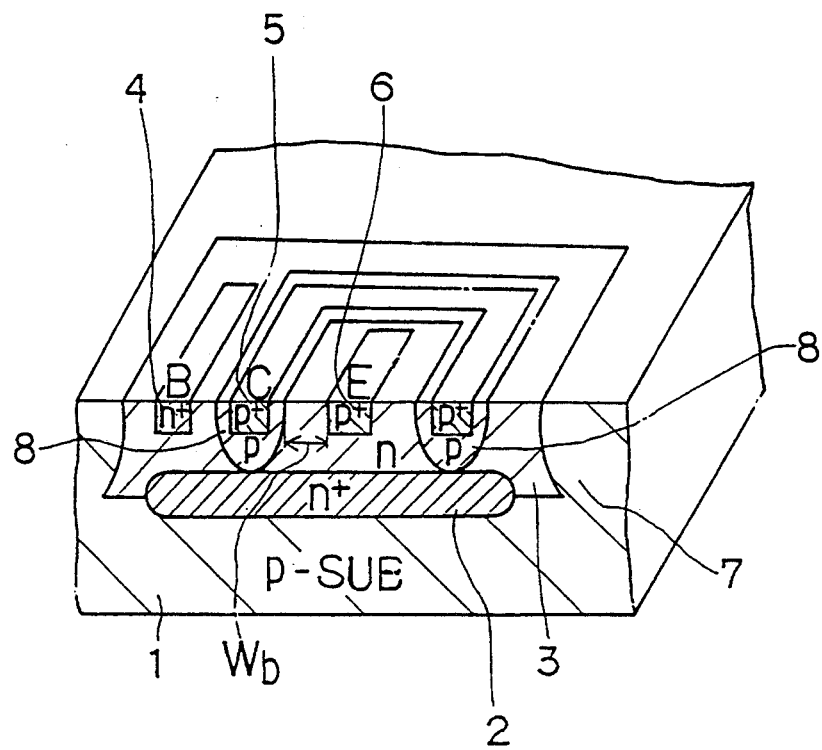
FIG. 1 is an illustrative view showing a sectional structure of an embodiment of a lateral transistor of the present invention.
Figure 2:
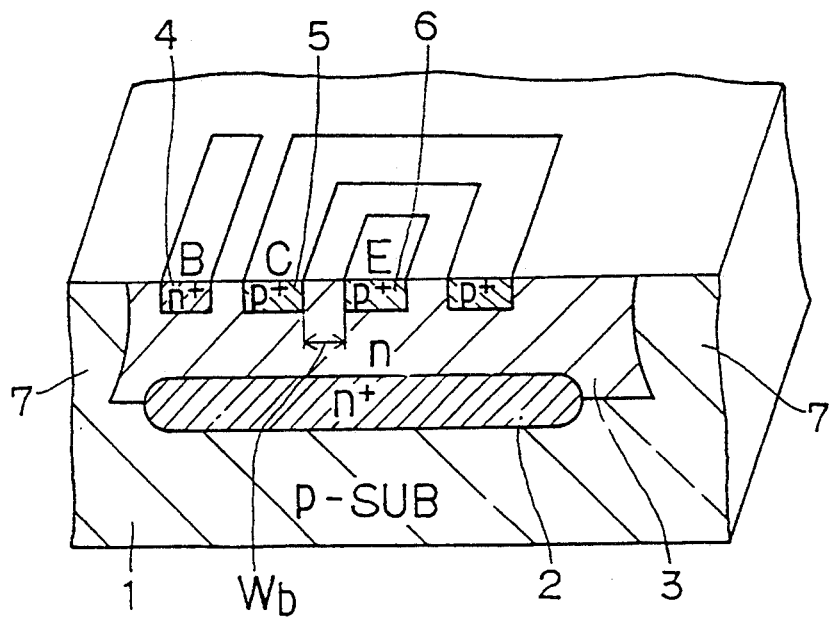
FIG. 2 is an illustrative view showing a sectional structure of a conventional lateral transistor.

Next, the present invention is explained in detail with reference to the drawings. In FIG. 1, numerals 1 to 7 denote the same portions as those of FIG. 2. Numeral 8 denotes a p-well which is formed before forming a collector zone 5 in such a manner that a p- zone having a low concentration almost comes into contact with a buried layer 2. If the p-well is so shallow, positive holes injected through an emitter reach a base 4 or a semiconductor substrate 1 like in the case of a conventional semiconductor. The p-well 8 is preferably formed in such a manner that the p-well 8 almost comes into contact with the buried layer 2.

However, in case that the p-well 8 does not contact with the buried layer 2, a large area of the collector 5 opposed to the emitter 6 is effective because the rate of positive holes which can be used is increased. On the contrary, if the p-well is formed too deeply, the concentration of the buried layer 2 at a junction becomes so high that withstand voltage thereof becomes undesirably small. This is not preferable.

Next, a method for producing the transistor is explained. Firstly, a n+-type buried layer 2 is formed in a p-type semiconductor substrate 1, and a n-type (a first conductivity-type) epitaxial layer 3 is formed. In the above forming step, for instance, donor impurities such as phosphorous, arsenic and antimony are injected, by ion injection method or the like, into a portion of the surface of the semiconductor substrate 1 on which a buried layer is formed. Then, an epitaxial growth is performed. The epitaxial growth is performed, for example, by arranging the semiconductor substrate in a horizontal-type or vertical-type furnace for epitaxial growth. After temperature in the furnace is increased to about 1100° C., mixed gas of gaseous hydrogen, dichlorosilane and phosphine is introduced, then silicone is produced by chemical reaction in the furnace. The silicone is deposited on the surface of the semiconductor substrate whereby a crystal layer of the silicone grows. At this epitaxial growth, phosphorus contained in phosphine is mixed into the crystal layer, so that n-type epitaxial layer grows. Silicone tetrachloride ($SiCl_4$), trichlorosilane ($SiHCl_3$), silane ($SiH_4$) and the like can be used instead of dichlorosilane. In this case, the epitaxial growth is performed under the condition that temperature in the furnace is from 1100° to 1200° C. As a material of impurities, arsine ($AsH_3$) and the like can be used instead of phosphine.

The process of epitaxial growth should be continued for about 18 minutes so that the epitaxial layer 3 grows to have a thickness of about 5 μm. During the epitaxial growth, the impurities injected into the semiconductor substrate 1 are diffused under this high temperature so that the impurities reach the semiconductor substrate 1 and the grown epitaxial layer 3. Thus the n+-type buried layer 2 having a high impurity concentration is formed. The buried layer 2 is formed in order to prevent positive holes from moving toward a bottom surface.

Next, the donor impurities such as phosphorus are diffused in a portion of the epitaxial layer 3 to which the base electrode is connected in order to form a region having a high impurity concentration for a contact with the base electrode.

The diffusion is performed, with the portion being masked, by thermal treatment at 900° C. for 30 minutes in an ambient atmosphere of gaseous phosphorus oxychloride. A mask used in the process has an opening corresponding to the region having a high impurity concentration.

Next, a p-type (a second conductivity-type) p-well 8 is formed in such a manner that acceptor impurities such as boron are diffused in the portion of the n-type epitaxial layer 3 on which a collector zone is formed. The impurities are injected into the p-well 8 so that the impurity concentration is about $10^{17}$ cm$^{-3}$. Thermal treatment at 1150° C. for 5 hours should be carried out in order to form the p-well 8 so deeply as to almost contact with the buried layer 2. Next, in order to form the collector zone and emitter zone, masking is applied except for the portions for the collector zone and the emitter zone and ion implantation is carried out at a rate of $10^{15}$ cm$^{-2}$. Thereafter, thermal treatment at 1080° C. for 35 minutes is carried out in an ambient atmosphere of gaseous hydrogen. Thus, p+-type (a second conductivity-type) layer is formed by diffusion of boron to become the collector zone and emitter zone. At this step, the impurity concentration of the p+-type layer is designed to be higher than that of the p-well 8 in order to improve electric conductivity.

Thus, the lateral transistor is formed and an integrated circuit can be constructed by performing an ohmic wiring among each electrode.

In the above method for producing a lateral transistor, a step for forming the p-well seems to be required in addition to the steps in the conventional method. However, when semiconductor integrated circuits are produced in practice, a large number of other circuit elements are also produced at the same time. For example, in the production process of BI-CMOS wherein a bipolar and a C-MOS are formed in the same chip, a p-well is formed when the N-MOS is formed. Therefore, a p-well of the lateral transistor can be formed in the same step of forming the p-well. For this reason, the steps of producing a lateral transistor are not increased.

The above explanation is based on an example of the lateral p-n-p transistor wherein the p-well is formed around the collector forming zone, because there are many cases that a p-n-p transistor is laterally formed due to the structural reason of the semiconductor integrated circuit. It is needless to say, that the present invention can be applied to a n-p-n transistor in view of the structure of the transistor.

Next, the lateral transistor of the present invention is explained in detail based on the following Example.

EXAMPLE 1

Impurity (arsenic) was injected into the p-type silicone substrate 1, mixed gas of dichlorosilane, hydrogen and phosphine was introduced in a furnace for epitaxial growth, and thermal treatment at 1100° C. for 18 minutes was carried out to grow a n-type epitaxial layer 3 of 5 μm in thickness. Next, an impurity layer 4 for a base contact was formed by thermal treatment at 90° C. for 30 minutes in an ambient atmosphere of gaseous phosphorus. Thereafter a p-well 8 having an impurity concentration of $10^{17}$ cm$^{-3}$ and a depth of 3 μm was formed by thermal treatment at 1150° C. for 5 hours in an ambient atmosphere of gaseous hydrogen after the ion implantation of boron at a rate of $10^{14}$ cm$^{-2}$. Then, thermal treatment at 1080° C. for 35 minutes in an ambient atmosphere of gaseous hydrogen was carried out after the ion implantation of boron at a rate of $10^{15}$ cm$^{-2}$ to form a collector zone and an emitter zone each having a depth of 2 μm. The current amplification factor $h_{fe}$ of the obtained lateral transistor was 200. That is, the current amplification factor of the obtained lateral transistor was about two times as large as that of the conventional lateral transistor of the same structure but having no p-well 8. The current amplification $h_{fe}$ of a p-n-p transistor in which the substrate function as a collector was 0.1. That is, the current amplification factor of the p-n-p transistor was reduced to about one-tenth of that of the conventional lateral transistor.

As mentioned above, according to the present invention, a well zone having the same conductivity-type as that of a collector zone and a lower concentration than the collector zone is formed in the portion on which the collector is to be formed. Therefore, the base width can be narrowly controlled compared with the masking method.

Furthermore, the well zone is formed deeply to a degree that the well zone almost contacts with the buried layer. Accordingly, positive holes through the emitter are prevented from moving toward the substrate so that they are effectively collected in the collector.

As a result, the lateral transistor having a high current amplification factor can be obtained whereas it is conventionally impossible. The steps of producing the lateral transistor are not increased. The lateral transistor can be produced easily in relation to producing steps of other elements. Thus, the lateral transistor is effectively utilized and the present largely effects an entire semiconductor circuit.

Though several embodiments of the present invention are described above, it is to be understood that the present invention is not limited only to the abovementioned embodiment, various changes and modifications may be made in the invention without departing from the spirit and scope thereof.

What is claimed is:

1. A lateral transistor, comprising:
 (a) a semiconductor substrate;
 (b) a buried layer formed in the semiconductor substrate;
 (c) an epitaxial layer formed on the buried layer and having a first conductivity-type of p-type or n-type;
 (d) two diffusion zones formed on the epitaxial layer and having a second conductivity-type opposite to the first conductivity-type, the two diffusion zones being an emitter zone and a collector zone;
 (e) a well zone surrounding the collector zone, said well zone being in physical contact with the buried layer; and
 (f) a base zone comprising an epitaxial layer interposed between the emitter zone and the collector zone,
wherein the well zone has the same conductive type as the collector zone and a lower concentration than the collector zone.

* * * * *